United States Patent

Masuhara et al.

[15] 3,700,981

[45] Oct. 24, 1972

[54] SEMICONDUCTOR INTEGRATED CIRCUIT COMPOSED OF CASCADE CONNECTION OF INVERTER CIRCUITS

[72] Inventors: Toshiaki Masuhara, Tokorozawa; Minoru Nagata, Kodaira; Masharu Kubo, Hachioji, all of Japan

[73] Assignee: Hitachi, Ltd., Tokyo, Japan

[22] Filed: May 24, 1971

[21] Appl. No.: 146,154

[30] Foreign Application Priority Data

May 27, 1970 Japan ......................45/44892

[52] U.S. Cl. ...........317/235 R, 307/304, 317/235 G, 330/35, 307/205

[51] Int. Cl. ..............................................H01l 19/00

[58] Field of Search .......317/235 B, 235 G; 307/205, 307/251, 279, 304; 330/35

*Primary Examiner*—Jerry D. Craig
*Attorney*—Craig & Antonelli

[57] ABSTRACT

A semiconductor device composed of cascade connected inverter circuits each comprising a load depletion type MIS transistor and a driving enhancement type MIS transistor. The semiconductor device can be properly operated by setting the threshold voltage of the load MIS transistors at a predetermined value, by selecting the dimensions and materials thereof.

2 Claims, 5 Drawing Figures

INVENTORS

TOSHIAKI MASUHARA, MINORU NAGATA and MASAHARU KUBO

BY Craig, Antonelli & Hill

ATTORNEYS

SEMICONDUCTOR INTEGRATED CIRCUIT COMPOSED OF CASCADE CONNECTION OF INVERTER CIRCUITS

BACKGROUND OF THE INVENTION

1. Field of the Invention

The present invention relates to a monolithic integrated circuit, and more particularly to an integrated circuit including a plurality of inverter circuits each comprising a driving field effect type transistor and a load field effect type transistor.

2. Description of the Prior Art

An inverter circuit has heretofore been proposed which employs an enhancement type MOS (metal oxide semiconductor ) transistor as a driving field effect type transistor and a depletion type MOS transistor as a load field effect type transistor. Such an inverter circuit is superior to an inverter circuit which employs enhancement type MOS transistors for both driving and load field effect transistors in that the voltage efficiency is higher, the transient response is faster and the source voltage can be made lower because the impedance of the load MOS transistor is lower.

Such inverter circuits are seldom used individually, but usually used in combination as, for example, a memory circuit or logic circuit. However, when the component elements composing the memory circuit or logic circuit have uneven characteristics, the memory circuit or logic circuit does not operate properly. Thus, although it has been known that an improved inverter circuit can be composed of an enhancement type MOS transistor and a depletion type MOS transistor, it has not been known before how to construct the elements of a circuit composed of a plurality of such inverter circuits to properly operate the circuit.

SUMMARY OF THE INVENTION

An object of the present invention is to provide a semiconductor device which comprises a plurality of inverter circuits and which operates properly.

In brief, the semiconductor device according to the present invention comprises a depletion type MIS (metal insulator semiconductor) transistor functioning as a load and an enhancement type MIS transistor functioning as a driver, the dimensions of the transistor and the material and thickness of the insulating film being selected so that the transistor has predetermined characteristics.

BRIEF DESCRIPTION OF THE DRAWING

FIGS. 2*a* and 2*b* are schematic diagrams of an embodiment of the present invention in which FIG. 2*a* is a cross-sectional view of a semiconductor device forming an inverter circuit, and FIG. 2*b* is a plan view of the impurity diffused regions and the gate electrode of the semiconductor circuit.

DESCRIPTION OF THE PREFERRED EMBODIMENTS

Figure 1:
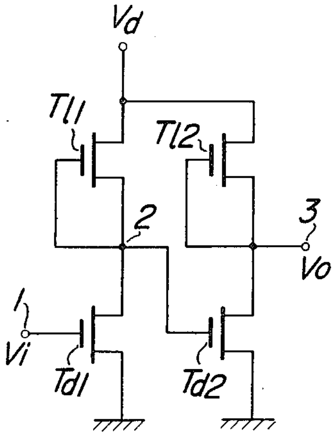
FIG. 1 is the circuit diagram of an embodiment of the present invention.

Refering to FIG. 1 which shows a circuit diagram of a pair of cascade connected inverter circuits, a first inverter comprises a driving enhancement type MIS transistor $T_{d1}$ and a load depletion type MIS transistor $T_{l1}$ and a second inverter similarly comprises a driving enhancement type MIS transistor $T_{d2}$ and a load depletion type MIS transistor $T_{l2}$. An input signal $V_i$ is supplied to an input terminal 1. The output signal of the first inverter is supplied through a junction point 2 to the second inverter, and the output signal $V_o$ of the second inverter is derived from an output terminal 3.

In the above-described inverter circuit, this fact is utilized for forming only the load MIS transistor into the depletion type that when, for example, the part of $SiO_2$ of a dual insulator layer of $Al_2O_3$ and $SiO_2$ is thin, positive holes are induced in the surface of a P conductivity type silicon substrate (ordinarily, the surface of a P conductivity type silicon substrate covered with an $SiO_2$ film becomes of N conductivity type).

Figure 2A:
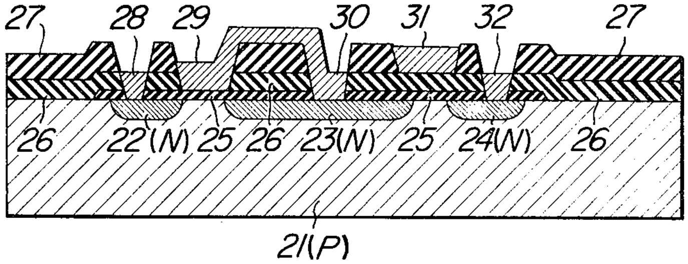
Figure 2B:
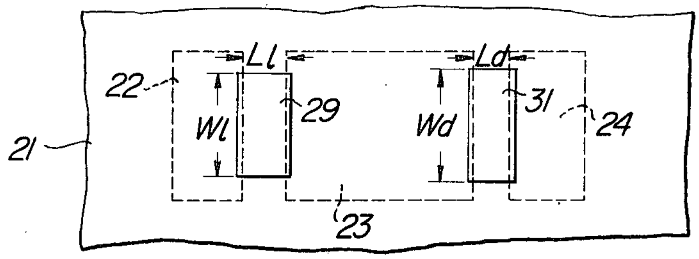

Referring now to FIGS. 2*a* and 2*b*, in a semiconductor substrate 21 having one conductivity type (for example, a P conductivity type silicon substrate) impurity diffused regions 22, 23 and 24 having an opposite conductivity type (for example, N conductivity type) are formed. The region 22 serves as the drain region of a load MOS transistor, the region 23 serves as the source region of the load MOS transistor and, at the same time, as the drain region of a driving MOS transistor, and the region 24 serves as the source region of the driving MOS transistor. An insulating layer 25, for example, an $SiO_2$ layer, is formed over the MOS transistors except for the portions where electrodes 28, 30 and 32 are provided. An insulating layer 26, for example, an $Al_2O_3$ layer, is formed over the exposed surface of the semiconductor substrate 21 and the insulating layer 25 except for the portion where the gate electrode 29 of the load MOS transistor is provided. The gate electrode 31 of the driving MOS transistor is provided on the insulating layer 26. An insulating layer 27, for example, an $SiO_2$ layer, is formed over the exposed surface of the insulating layer 26. The electrode 30, which is common to the source electrode of the load MOS transistor and the drain electrode of the driving MOS transistor, is connected with the gate electrode 29 of the load MOS transistor. The electrode 28 is the drain electrode of the load MOS transistor.

Figure 3:
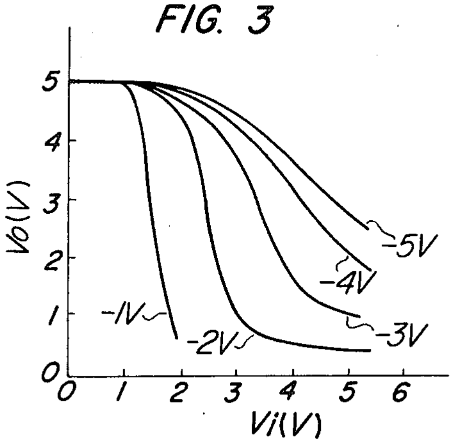
FIG. 3 is a graph of input versus output characteristics of an inverter circuit for explaining an embodiment of the present invention.

In this manner a load depletion type MOS transistor and a driving enhancement type MOS transistor are formed. The relation between the input $V_i$ and the output $V_o$ of the thus formed inverter circuit varies greatly, to an extent depending on the threshold voltage $V_{t1}$ of the load depletion type MOS transistor as shown in FIG. 3, where the source voltage $V_d$ is set at 5 volts. Consequently, although a plurality of inverter circuits having certain characteristics can be connected to form a proper memory circuit or logic circuit, a memory or logic circuit formed of those having other characteristics does not properly operate. For example, at a threshold voltage $V_{t1}$ of −2 volts the output voltage of the first inverter circuit is 0.5 volt for an input voltage $V_i$ of 5 volts. The output voltage 0.5 volt of the first inverter circuit is an input to the second inverter circuit, the output $V_o$ of which 5 volts. Thus, there is no loss of the input signal relative to the output signal. Such converters properly operate even if connected in multiple stages. However, if the threshold voltage $V_{tl}$ of the inverter circuits is −5 volts, the output voltage of the first inverter circuit is about 3 volts for an input voltage $V_i$ of 5 volts, and the output voltage $V_o$ of the second inverter circuit is 4.5 volts. Thus, the inverters do not operate properly in that the output voltage is low relative to the input voltage, from which it is clear that a proper output cannot be obtained relative to an input when such inverter circuits are connected in multiple stages. Consequently, to construct a predetermined circuit by connecting inverter circuits in multiple stages it is necessary to construct the circuit out of transistor elements having a predetermined threshold voltage $V_{tl}$.

The threshold voltage $V_{tl}$ of a transistor element is determined by the impurity concentration and dielectric constant of the semiconductor substrate, the thickness and dielectric constant of the gate insulator layer, or the like. Consequently, it is necessary for the proper operation of the circuit to set these quantities at predetermined values.

The current $I_l$ which flows through the load depletion type MIS transistor is $$I_l=\frac{\beta_l}{2}V_{tl}^2 \qquad (1)$$

where $$\beta_l=\frac{W_l}{L_l}\left(\frac{1}{\frac{T_1}{\epsilon_1}+\frac{T_2}{\epsilon_2}+\ldots+\frac{T_n}{\epsilon_n}}\right)\mu_l$$

- $L_l$ and $W_l$ are the length and width, respectively, of the channel in the transistor as shown in FIG. 2*b*,
- $\epsilon_1, \epsilon_2, \ldots \epsilon_n$ are the dielectric constants of the gate insulator layers,
- $T_1, T_2, \ldots, T_n$ are the thicknesses of the gate insulating layers, and
- $\mu_l$ is the mobility in the channel.

The current $I_d$ which flows through the driving enhancement type MIS transistor is $$I_d=\beta_d\left\{(V_i-V_{td})V_o-\frac{1}{2}V_o^2\right\} \qquad (2)$$

where $V_i$ is the input voltage and $V_o$ is the output voltage. If the inverter circuit is in an on-condition, $V_i - V_{td} >> \frac{1}{2} V_o$. Therefore, Equation (2) becomes $$I_d \approx \beta_d (V_i - V_{td}) V_o \qquad (3)$$

where $$\beta_d=\frac{W_d}{L_d}\left(\frac{1}{\frac{T_1'}{\epsilon_1'}+\frac{T_2'}{\epsilon_1'}+\ldots+\frac{T_n'}{\epsilon_n'}}\right)\mu_d$$

- $L_d$ and $W_d$ are the length and width, respectively, in the channel of the transistor as shown in FIG. 2*b*,
- $\epsilon_1', \epsilon_2', \ldots, \epsilon_n'$ are the dielectric constants of the gate insulator layers,
- $T_1', T_2', \ldots, T_n'$ are the thickness of the gate insulator layers, $\mu_d$ is the mobility in the channel, and
- $V_{td}$ is the threshold voltage of the driving MIS transistor.

From the fact that in the inverter circuit $I_l = I_d$ and the highest level of the input signal $V_i$ (the output voltage when the inverter of the preceding stage is in an off state) is approximately equal to the source voltage $V_d$, i.e., $V_i \approx V_d$, the output voltage $V_o$ when the inverter is in an on state is expressed from Equations (1) and (3) as follows:

$$V_0=\frac{\beta_l V_{tl}^2}{2\beta_d(V_d-V_{td})} \qquad (4)$$

If the output voltage $V_o$ of Equation (4) is the output voltage of the first inverter circuit, this voltage becomes an input voltage to the second inverter circuit. In order to obtain the condition that the output signal of the second inverter circuit becomes the same level of signal as $V_d$, the following relation should be satisfied:

$$V_o < V_{td} \qquad (5)$$

From relations (4) and (5) it follows that $$|V_{tl}|<\sqrt{\frac{\beta_d}{\beta_l}}\cdot\sqrt{2(V_d-V_{td})V_{td}} \qquad (6)$$

Consequently, by selecting the dimensions and materials of the load and driving MIS transistors so that they satisfy the relation (6), the circuit composed of such transistor elements can always be operated stably.

As described above, the circuit operates better by setting the absolute value of the threshold voltage $V_{tl}$ of the load depletion type MIS transistor at a value equal to or lower than a predetermined value. However, the threshold voltage $V_{tl}$ varies depending on the voltage at the output terminal of the inverter circuit. This variation $\Delta V_{tl}$ is expressed by $$\Delta V_{tl}=\left(\frac{T_1}{\epsilon_1}+\frac{T_2}{\epsilon_2}+\ldots+\frac{T_n}{\epsilon_n}\right)\cdot\sqrt{2q\epsilon_s N}\cdot\sqrt{V_d} \qquad (7)$$

where

- $q$ is the electronic charge,
- $\epsilon_s$ is the dielectric constant of the semiconductor substrate, and
- N is the impurity concentration in the semiconductor substrate.

Figure 4:
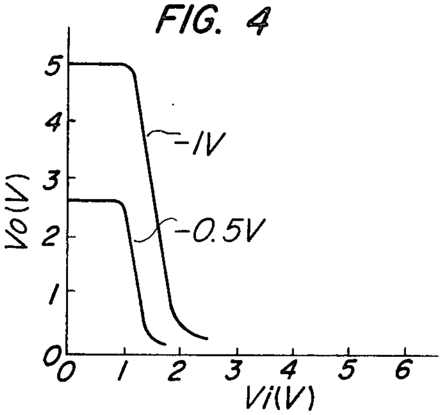
FIG. 4 is an input versus output characteristic chart for explaining another embodiment of the present invention.

When the variation $\Delta V_{tl}$ is larger than $|V_{tl}|$, the load MIS transistor operates in an enhancement mode and no longer operates in a depletion mode. That is, as is shown by the input $V_i$ versus output $V_o$ characteristics in FIG. 4, the off-level of the inverter circuit is sufficiently high (equal to the source voltage $V_{tl}$ =5 volts) when $V_{tl}$ =−1 volt, but lowers (about 2.6 volts) when $V_{tl}$ =−0.5 volt, not to satisfactorily operate though not mal-functioning. Consequently, in order to improve the transient response with a low impedance, the threshold voltage $V_{tl}$ of the load MIS transistor is determined so that the relation $$|V_{tl}|>\Delta V_{tl} \qquad (8)$$

is satisfied.

The above description has been made with reference to a pair of cascade connected inverter circuits by way of example. However, the present invention is also applicable to the cascade connection of three or more inverter circuits, flip-flop connection, etc.

We claim:

1. A semiconductor integrated circuit comprising a plurality of cascade connected inverter circuits each comprising a depletion mode MIS transistor having a drain electrode connected to a bias voltage source, a gate electrode, and a source electrode connected to said gate electrode, and operating in the saturation region of the drainvoltage-drain current characteristic thereof, and an enhancement mode MIS transistor having a drain electrode connected to said source electrode of said depletion mode transistor, a gate electrode connected to an input terminal for receiving an input signal, and a source electrode connected to a constant bias source, and operating in the triode region of the drain voltage-drain current characteristic thereof when an input signal is supplied to said input terminal, and wherein the dimensions of the transistors are selected so that the channel conductance $\beta_d$ and $\beta_l$ of each MIS transistor satisfies the following relationship with respect to the threshold voltage $V_{tl}$ of the depletion mode MIS transistor:

$$\sqrt{\frac{\beta_d}{\beta_l}} > \frac{|V_{tl}|}{\sqrt{2(V_d - V_{td})V_{td}}}$$

where $$\beta_l = \frac{W_l}{L_l}\left(\frac{1}{\frac{T_1}{\epsilon_1}+\frac{T_2}{\epsilon_2}+\ldots\frac{T_n}{\epsilon_n}}\right)\mu_l$$

$$\beta_d = \frac{W_d}{L_d}\left(\frac{1}{\frac{T_1'}{\epsilon_1'}+\frac{T_2'}{\epsilon^{2\prime}}+\ldots\frac{T_n'}{\epsilon_n'}}\right)\mu_d$$

$L_l$ and $L_d$ are the lengths of the channels in said depletion and enhancement mode transistors, respectively, $W_l$ and $W_d$ are the widths of the channels in said depletion and enhancement mode transistors, respectively, $V_d$ is the source voltage, $V_{td}$ is the threshold voltage of said enhancement mode transistor, $\epsilon_1, \epsilon_2, \ldots\ldots\epsilon_n$ are the dielectric constants of the gate insulator layers of said depletion mode MIS transistor, $T_1, T_2, \ldots\ldots T_n$ are the thicknesses of the gate insulator layers of said depletion mode transistor, $T_1', T_2', \ldots. T_n$40 are the thicknesses of the gate insulator layers of said enhancement mode MIS transistor, and $\mu_l$ and $\mu_d$ are the mobilities in the channels of said depletion and enhancement mode MIS transistors, respectively.

2. A semiconductor device according to claim 1, in which said threshold voltage $V_{tl}$ of said depletion mode MIS transistor further satisfies the relation:

$$|V_{tl}| > \left(\frac{T_1}{\epsilon_1}+\frac{T_2}{\epsilon_2}+\cdots+\frac{T_n}{\epsilon_n}\right)\sqrt{2q\epsilon_s N}\cdot\sqrt{V_d}$$

where $q$ is the electron charge, $\epsilon_s$ is the dielectric constant of the semiconductor substrate, and $N$ is the impurity concentration in the semiconductor substrate.

* * * * *